(12) United States Patent
Hsieh

(10) Patent No.: US 8,981,350 B2
(45) Date of Patent: Mar. 17, 2015

(54) PIXEL STRUCTURE OF ORGANIC LIGHT EMITTING DIODE DISPLAY

(75) Inventor: Hsing-Hung Hsieh, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 223 days.

(21) Appl. No.: 13/009,835

(22) Filed: Jan. 19, 2011

(65) Prior Publication Data

US 2011/0248245 A1 Oct. 13, 2011

(51) Int. Cl.
*H01L 51/00* (2006.01)
*H01L 27/32* (2006.01)
*H01L 27/12* (2006.01)

(52) U.S. Cl.
CPC ........ *H01L 27/3244* (2013.01); *H01L 27/1214* (2013.01); *H01L 27/1225* (2013.01); *H01L 27/1251* (2013.01)
USPC .......................................................... 257/40

(58) Field of Classification Search
USPC ................ 257/40, E51.001, E51.018; 438/34
See application file for complete search history.

(56) References Cited

U.S. PATENT DOCUMENTS

| | | | |
|---|---|---|---|
| 7,382,421 B2 | 6/2008 | Hoffman | |
| 2004/0222472 A1 | 11/2004 | Suzuki | |
| 2007/0139314 A1* | 6/2007 | Park | 345/76 |
| 2007/0241333 A1* | 10/2007 | Park et al. | 257/61 |
| 2009/0072226 A1* | 3/2009 | Koo et al. | 257/40 |
| 2009/0081826 A1* | 3/2009 | Cowdery-Corvan et al. | 438/104 |
| 2010/0001284 A1* | 1/2010 | Cho et al. | 257/72 |
| 2010/0267197 A1* | 10/2010 | Shieh et al. | 438/104 |
| 2010/0289024 A1* | 11/2010 | Ito | 257/59 |

* cited by examiner

*Primary Examiner* — Vongsavanh Sengdara
(74) *Attorney, Agent, or Firm* — Winston Hsu; Scott Margo

(57) ABSTRACT

A pixel structure of an organic light emitting diode display includes a first transistor and a second transistor. The first transistor includes a first drain electrode and a first source electrode. When a voltage difference is provided between the first drain electrode and the first source electrode, the first transistor has a first subthreshold slope (SS). The second transistor includes a second drain electrode and a second source electrode. When the voltage difference is provided between the second drain electrode and the second source electrode, the second transistor has a second SS, and the second SS is larger than the first SS.

8 Claims, 14 Drawing Sheets

| Channel width ($\mu$m) | 6 | 8 | 10 | 11 |
|---|---|---|---|---|
| Mobility (cm$^2$/Vs) | 5.49 | 5.59 | 5.03 | 5.55 |
| Subthreshold slope (V/decade) | 0.20 | 0.35 | 0.37 | 0.43 |

FIG. 14

PIXEL STRUCTURE OF ORGANIC LIGHT EMITTING DIODE DISPLAY

BACKGROUND OF THE INVENTION

1. Field of the Invention

The present invention relates to a pixel structure of an organic light emitting diode display and a manufacturing method thereof, and more particularly, to a pixel structure of an organic light emitting diode display having two diodes with different current-voltage characteristics.

2. Description of the Prior Art

Recently, organic light emitting diode (OLED) displays have become popular flat displays because of having the advantages of self-luminescence, wide viewing angle, fast response time, high illumination efficiency, low operating voltage, thin panel thickness, flexibility and a simple fabricating process, and thus, the OLED displays have been widely applied to various kinds of flat display products.

A pixel structure of the OLED display includes an OLED, a driving transistor and a switching transistor. The driving transistor is electrically connected to the organic OLED so as to control a switch of the OLED. The switching transistor is electrically connected to the driving transistor so as to control a switch of the driving transistor. Generally, in a manufacturing process of the OLED display, the driving transistor and the switching transistor are fabricated by the same process, so that the driving transistor and the switching transistor can have the same current-voltage characteristics. Thus, the driving transistor and the switching transistor have the same sub-threshold slope (SS).

However, when the driving transistor and the switching transistor have the same SS, the switching transistor cannot turn on the driving transistor rapidly, so that the OLED display easily generates residual images. Or, the driving transistor provides current having no linear relation with voltage to the OLED, so that the OLED cannot display various brightness variations in relation to different gray levels. For these reasons, to manufacturing the switching transistor and the driving transistor with different current-voltage characteristics is an objective in the industry.

SUMMARY OF THE INVENTION

It is one of the objectives of the present invention to provide a pixel structure of an organic light emitting diode (OLED) display to have a driving transistor and a switching transistor with different current-voltage characteristics.

According to a preferred embodiment of the present invention, a pixel structure of an OLED display is provided. The pixel structure comprises a substrate, a first transistor disposed on the substrate, a second transistor disposed on the substrate, and a first patterned passivation layer covering a part of the first transistor and the second transistor. The first transistor comprises a first gate electrode, an insulating layer covering the first gate electrode and the substrate, a first drain electrode disposed on the insulating layer, a first source electrode disposed on the insulating layer, and a first channel layer disposed on the insulating layer between the first drain electrode and the first source electrode. When a voltage difference is provided between the first drain electrode and the first source electrode of the first transistor, the first transistor has a first subthreshold slope (SS). The second transistor comprises a second gate electrode disposed between the insulating layer and the substrate, a second drain electrode disposed on the insulating layer, a second source electrode disposed on the insulating layer, and a second channel layer disposed on the insulating layer between the second drain electrode and the second source electrode. When the voltage difference is provided between the second drain electrode and the second source electrode of the second transistor, the second transistor has a second SS, and the second SS is larger than the first SS.

According to a preferred embodiment of the present invention, a manufacturing method of a pixel structure of an OLED display is provided. First, a substrate is provided, and then, a first gate electrode, a second gate electrode, an insulating layer, a first drain electrode, a first source electrode, a second drain electrode and a second source electrode are formed. Next, a first channel layer and a first oxide layer on the first drain electrode, the first source electrode and the insulating layer are formed. Subsequently, a second channel layer on the second drain electrode, the second source electrode and the insulating layer are formed. A first patterned passivation layer is then formed on the substrate, and the first patterned passivation layer exposes a part of the second drain electrode.

The present invention utilizes the first SS of the first transistor being smaller than the second SS of the second transistor to differentiate the current-voltage characteristics of the first transistor and the second transistor, so that the first transistor can have a faster switching rate, and the second transistor can provide various values of the second drain current.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 14 is a schematic diagram illustrating a relationship between the channel width and the SS of the transistor of the second preferred embodiment in the condition of the channel length being substantially 4 micrometers.

DETAILED DESCRIPTION

To provide a better understanding of the present invention, preferred embodiments will be detailed as follows. The preferred embodiments of the present invention are illustrated in the accompanying drawings with numbered elements to elaborate the contents and effects to be achieved.

Figure 1:
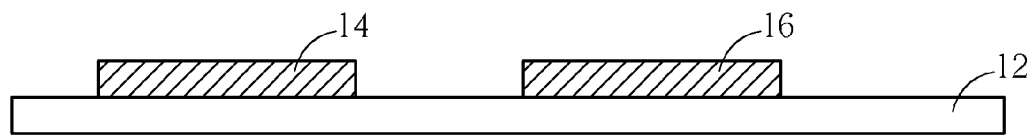
FIG. 1 through FIG. 5 are schematic diagrams illustrating a manufacturing method of a pixel structure of an organic light emitting diode (OLED) display according to a first preferred embodiment of the present invention.
Figure 2:
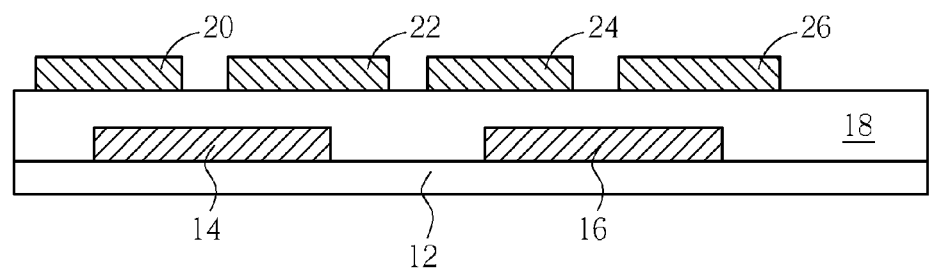

Refer to FIG. 1 through FIG. 5, which are schematic diagrams illustrating a manufacturing method of a pixel structure of an organic light emitting diode (OLED) display according to a first preferred embodiment of the present invention. As shown in FIG. 1, a substrate 12 is provided first. The substrate 12 can be any kind of substrate for manufacturing thin film transistors, such as a silicon substrate, a glass substrate or a plastic substrate, etc. Then, a first metal layer is formed on the substrate 12. A first photolithographic and etching process is then performed to pattern the first metal layer, so that a first gate electrode 14 and a second gate electrode 16 are formed. The first gate electrode 14 is regarded as a gate electrode of a first transistor, and the second gate electrode 16 is regarded as a gate electrode of a second transistor. Next, as shown in FIG. 2, the first gate electrode 14, the second gate electrode 16 and the substrate 12 are covered with an insulating layer 18 to electrically insulate the first gate electrode 14 and the second gate electrode 16 from a metal layer formed in the subsequent steps. Parts of the insulating layer 18 respectively disposed on the first gate electrode 14 and the second gate electrode 16 are regarded as gate insulating layers of the first transistor and the second transistor. A material of the insulating layer includes silicon oxide (SiOx), silicon nitride (SiNy) or silicon oxynitride (SiOxNy), and the present invention is not limited to this. Subsequently, a second metal layer is formed on the insulating layer. A second photolithographic and etching process is then performed to pattern the second metal layer, so that a first source electrode 20, a first drain electrode 22, a second source electrode 24 and a second drain electrode 26 are formed. The first source electrode 20 and the first drain electrode 22 partially overlap the first gate electrode 14, and the second source electrode 24 and the second drain electrode 26 partially overlap the second gate electrode 16. The first source electrode 20 and the first drain electrode 22 are respectively regarded as a source electrode and a drain electrode of the first transistor, and the second source electrode 24 and the second drain electrode 26 are respectively regarded as a source electrode and a drain electrode of the second transistor.

Figure 3:
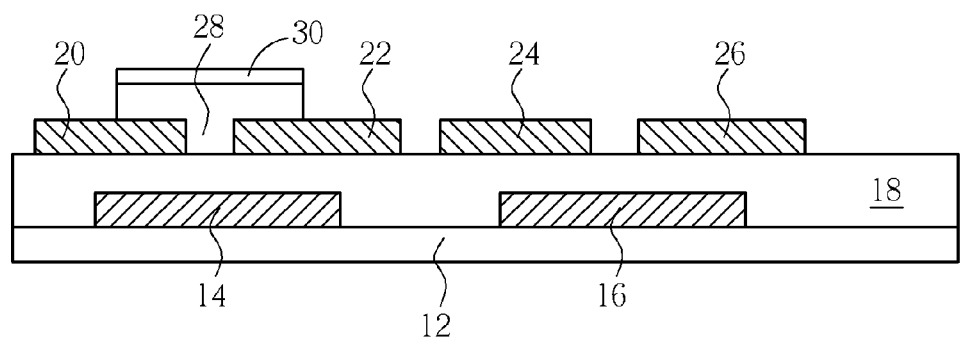
Figure 4:
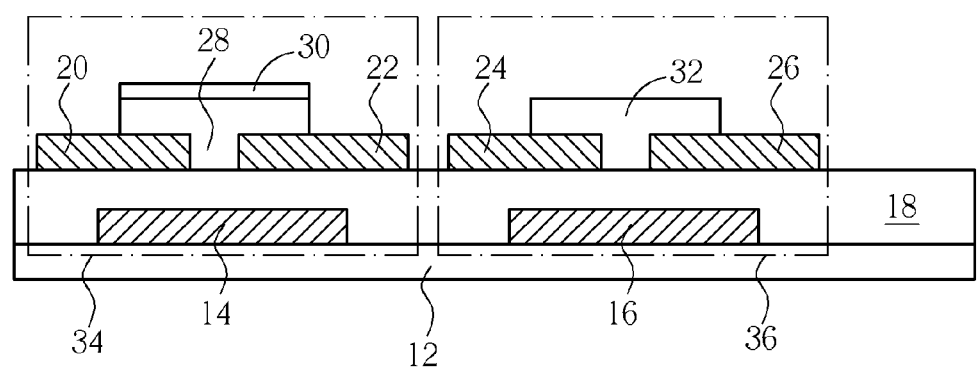

Next, as shown in FIG. 3, the substrate 12 is covered with a channel material layer, and then, the channel material layer is covered with an oxide layer. A third photolithographic and etching process is then performed to pattern the channel material layer and the oxide layer, so that a first channel layer 28 and a first oxide layer 30 are simultaneously formed on the insulating layer 18 between the first source electrode 20 and the first drain electrode 22, and the first oxide layer 30 is aligned to the first channel layer 28. Then, as shown in FIG. 4, the substrate 12 is covered with a channel material layer, and a fourth photolithographic and etching process is performed to pattern the channel material layer so as to form a second channel layer 32 on the insulating layer 18 between the second source electrode 24 and the second drain electrode 26. In this preferred embodiment, the channel material layer includes a metal oxide, polysilicon or amorphous silicon, wherein the metal oxide is selected from indium gallium zinc oxide (IGZO), indium oxide, zinc oxide and gallium oxide, but is not limited to this. In addition, a material of the first oxide layer 30 includes silicon oxide, and is not limited to this. The first channel layer 28 is disposed between the first source electrode 20 and the first drain electrode 22 so as to be regarded as a channel of the first transistor. The first channel layer 28 partially covers the first source electrode 20 and the first drain electrode 22, and the first gate electrode 14, the insulating layer 18, the first source electrode 20, the first drain electrode 22, the first channel layer 28 and the first oxide layer 30 constitute the first transistor 34. The second channel layer 32 is disposed between the second source electrode 24 and the second drain electrode 26 so as to be regarded as a channel of the second transistor. The second channel layer 32 partially covers the second source electrode 24 and the second drain electrode 26, and the second gate electrode 16, the insulating layer 18, the second source electrode 24, the second drain electrode 26 and the second channel layer 32 constitute the second transistor 36.

Figure 5:
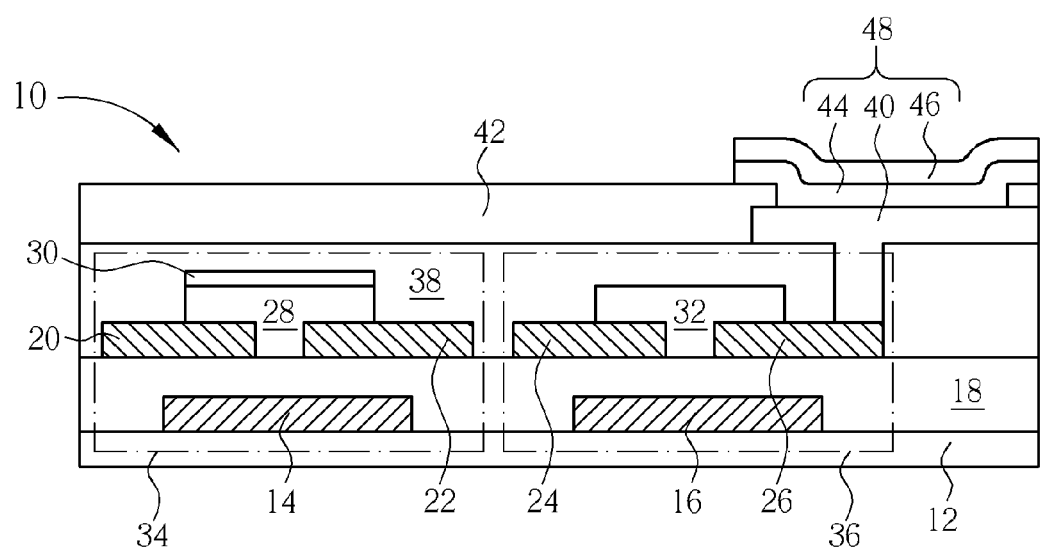

Next, as shown in FIG. 5, a fifth photolithographic and etching process is performed to form a first patterned passivation layer 38 on the substrate 12 so as to protect the first transistor 34 and the second transistor 36, and the first patterned passivation layer 38 exposes a part of the second drain electrode 26. Thereafter, a sixth photolithographic and etching process is used to form a transparent electrode 40 on the exposed second drain electrode 26 and the first patterned passivation layer 38 so as to electrically connect the second drain electrode 26 of the second transistor 36 to an OLED formed in following steps. Then, a seventh photolithographic and etching process is utilized to form a second patterned passivation 42 on the transparent electrode 40 and the first patterned passivation layer 38 and to expose a part of the transparent electrode 40. Then, an organic light emitting layer 44 and a metal electrode 46 are sequentially formed on the exposed transparent electrode 40, and a pixel structure 48 of the OLED display of this preferred embodiment is therefore completed. Furthermore, the transparent electrode 40, the organic light emitting layer 44 and the metal electrode 46 constitute an OLED 48. The transparent electrode 40 is regarded as an anode of the organic light emitting diode, and the metal electrode 46 is regarded as a cathode of the organic light emitting diode 48. The transparent electrode 40 is composed of a transparent conductive material with high work function, such as indium zinc oxide or indium tin oxide. The metal electrode 46 is composed of a conductive material with low work function and erosion, such as aluminum or alloy of aluminum and magnesium.

Figure 6:
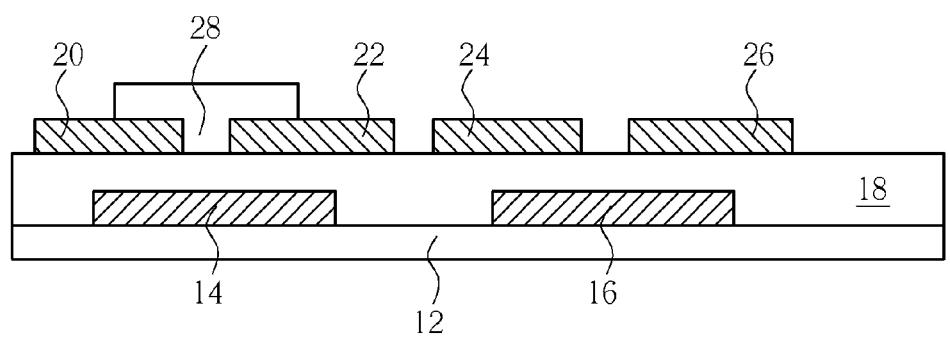
FIG. 6 is another example illustrating a manufacturing method of the pixel structure according to the first preferred embodiment of the present invention.

Refer to FIG. 6, and refer to FIG. 1 through FIG. 5 again. FIG. 6 is another example illustrating a manufacturing method of the pixel structure according to the first preferred embodiment of the present invention. Different from the above-mentioned preferred embodiment, the first channel layer and the first oxide layer of this example are not formed simultaneously. As shown in FIG. 6, the steps shown in FIG. 1 and FIG. 2 are utilized to manufacture the substrate 12, the first gate electrode 14, the second gate electrode 16, the insulating layer 18, the first source electrode 20, the first drain electrode 22, the second source electrode 24 and the second drain electrode 26, and then, a deposition process is performed to form a channel material layer. Next, a photolithographic and etching process is performed to pattern the channel material layer so as to form the first channel layer 28. Thereafter, an oxidation process is performed to form the first oxide layer 30 on the first channel layer 28, as shown in FIG. 3. The following steps of this example are the same as the steps shown in FIG. 4 and FIG. 5 of the above-mentioned preferred embodiment, and is not detailed redundantly.

Figure 7:
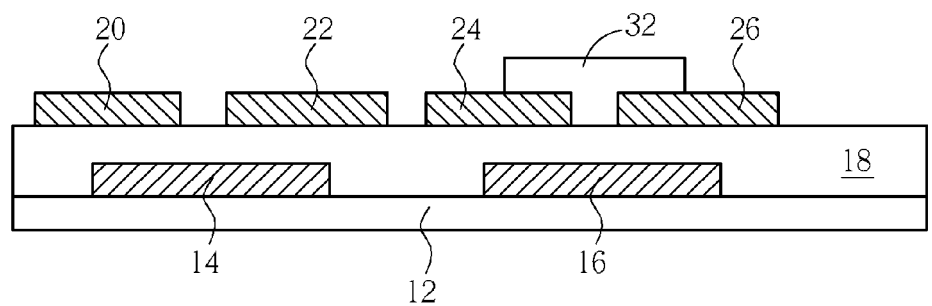
FIG. 7 is another example illustrating a manufacturing method of the pixel structure according to the first preferred embodiment of the present invention.

In addition, the present invention is not limited that the first channel layer and the first oxide layer are formed before forming the second channel layer. The present invention also can form the second channel layer before forming the first channel layer and the first oxide layer. Refer to FIG. 7, and refer to FIG. 1, FIG. 2, FIG. 4 and FIG. 5 also. FIG. 7 is another example illustrating a manufacturing method of the pixel structure according to the first preferred embodiment of the present invention. As shown in FIG. 7, as compared with the above-mentioned preferred embodiment, the manufacturing method in this example also utilizes the steps shown in FIG. 1 and FIG. 2 to manufacture the substrate 12, the first gate electrode 14, the second gate electrode 16, the insulating layer 18, the first source electrode 20, the first drain electrode 22, the second source electrode 24 and the second drain electrode 26. Then the second channel layer 32 is formed. After the second channel layer 32 is formed, as shown in FIG. 4, the first channel layer 28 and the first oxide layer 30 are formed. The following steps of this example are the same as the steps shown in FIG. 5 of the above-mentioned preferred embodiment, and is not detailed redundantly.

Figure 8:
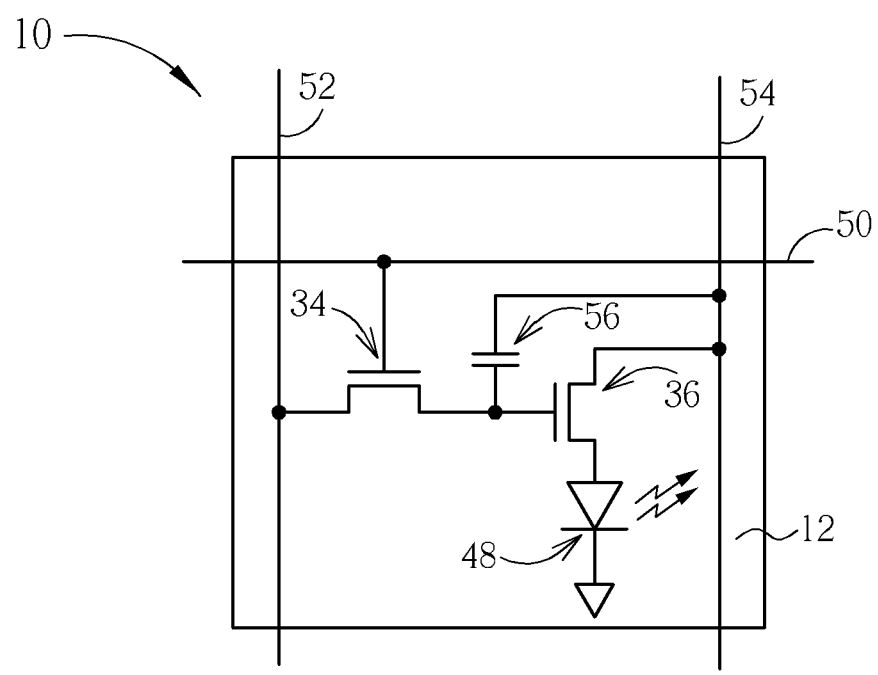
FIG. 8 is a circuit diagram of the pixel structure of the first preferred embodiment.

In order to clearly describe operation and advantage of the pixel structure of the first preferred embodiment, the material of the first channel layer and the second channel layer take the metal oxide as an example in the following description, and are not limited to this. Refer to FIG. 8, and refer to FIG. 5 again. FIG. 5 and FIG. 8 are schematic diagrams illustrating the pixel structure of the OLED display according to the first preferred embodiment of the present invention. FIG. 5 is a cross-sectional diagram of the pixel structure of the first preferred embodiment, and FIG. 8 is a circuit diagram of the pixel structure of the first preferred embodiment. As shown in FIG. 8, besides the first transistor 34, the second transistor 36 and the OLED 48, the pixel structure 10 of the OLED display further includes a scan line 50, a data line 52, a power source line 54, and a storage capacitor 56, disposed on the substrate 12. The first gate electrode 14 is electrically connected to the scan line 50; the first source electrode 20 is electrically connected to the data line 52; and the first drain electrode 22 is electrically connected to the second gate electrode 16 and an end of the storage capacitor 56. The other end of the storage capacitor 56 is electrically connected to the power source line 54, and the second source electrode 24 is also electrically connected to the power source line 54. The second drain electrode 26 is electrically connected to the anode of the OLED 48. The cathode of the OLED 48 is electrically connected to a ground end. In this preferred embodiment, the first transistor 34 is a switching transistor, and is used to switch the pixel structure 10 and to transfer display signals to the storage capacitor 56 and the second transistor 36. The second transistor 36 is a driving transistor. When the first transistor 34 transfer the display signals to the storage capacitor 56, the second transistor 36 is turned on, and current provided from the power source line 54 drives the OLED 48 through the second transistor 36, so that the OLED 48 generates light. As shown in FIG. 5, it should be noted that the first transistor 34 regarded as the switching transistor in the first preferred embodiment further has the first oxide layer 30 as compared with the second transistor 36 regarded as the driving transistor. The first oxide layer 30 is disposed between the first channel layer 28 and the first patterned passivation layer 38, and is in contact with the first channel layer 28. Furthermore, the second transistor 36 does not include the oxide layer, so that the first patterned passivation layer 38 disposed on the second transistor 36 is directly in contact with the second channel layer 32, and covers the top surface of the second channel layer 32. For this reason, the current-voltage characteristic of the first transistor 34 is different from the current-voltage characteristic of the second transistor 36.

Figure 9:
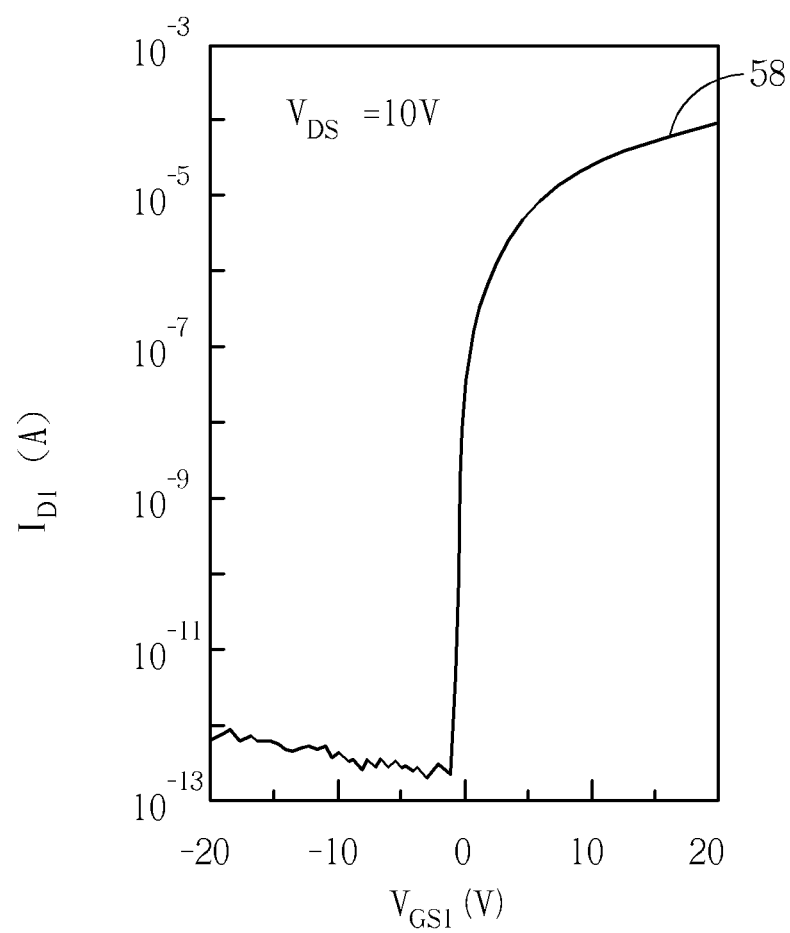
FIG. 9 is a schematic diagram illustrating a relationship between a first drain current $I_{D1}$ of the first transistor and a voltage difference $V_{GS1}$ provided between the first gate electrode and the first source electrode in the first preferred embodiment.
Figure 10:
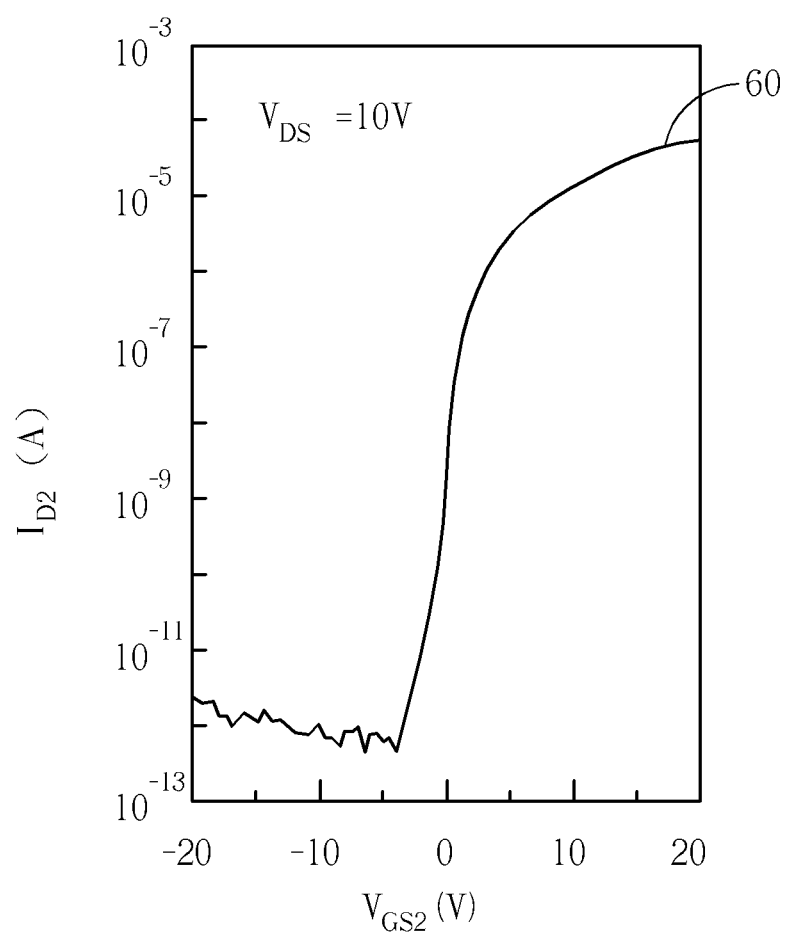
FIG. 10 is a schematic diagram illustrating a relationship between a second drain current $I_{D2}$ of the second transistor and a voltage difference $V_{GS2}$ provided between the second gate electrode and the second source electrode in the first preferred embodiment.

The present invention utilizes a subthreshold slope (SS) of a transistor to compare the current-voltage characteristic of the first transistor with the current-voltage characteristic of the second transistor. Refer to FIG. 9 and FIG. 10, and refer to FIG. 5 again. FIG. 9 is a schematic diagram illustrating a relationship between a first drain current $I_{D1}$ of the first transistor and a voltage difference $V_{GS1}$ provided between the first gate electrode and the first source electrode in the first preferred embodiment, and FIG. 10 is a schematic diagram illustrating a relationship between a second drain current $I_{D2}$ of the second transistor and a voltage difference $V_{GS2}$ provided between the second gate electrode and the second source electrode in the first preferred embodiment. The following description takes the first transistor as an example to detail the method of measuring the SS. As shown in FIG. 5, a specific voltage difference $V_{DS}$, such as 10 volts (V), is first provided between the first drain electrode 22 and the first source electrode 20 of the first transistor 34, and the first source electrode 20 of the first transistor 34 is electrically connected to the ground end. Then, a modulated voltage difference is further provided between the first gate electrode 14 and the first source electrode 20 of the first transistor 34, and the first drain current $I_{D1}$ of the first transistor 34 is measured simultaneously. Furthermore, the modulated voltage difference of the first preferred embodiment ranges from −20 volts to +20 volts, so that the corresponding first drain current $I_{D1}$ can be obtained with relation to the values of the modulated voltage difference. The curve 58 illustrating the relationship between the first drain current $I_{D1}$ of the first transistor 34 and the voltage difference $V_{GS1}$, as shown in FIG. 9. The range of the modulated voltage difference in the present invention is not limited to this. In addition, the curve 58 illustrating the relationship between the first drain current $I_{D1}$ and the voltage difference $V_{GS1}$ between the first gate electrode 14 and the first source electrode 20 has a linear segment that shows the first drain current $I_{D1}$ changed rapidly in relation to the voltage difference $V_{GS1}$, and a reciprocal of the slope of the linear segment is the SS. That is, the higher the slope of the linear segment is, the smaller the SS is, and the SS can be calculated according to a formula $dV_{GS}/d\log(I_D)$. Therefore, when the specific voltage difference $V_{DS}$ is provided between the first drain electrode 22 and the first source electrode 20 of the first transistor 34, the first transistor 34 has a first SS. Similarly, the curve 60 illustrating the relationship between the voltage difference $V_{GS2}$ between the second gate electrode 16 and the second source electrode 24 and the second drain current $I_{D2}$ of the second transistor 36 can be measured, as shown in FIG. 10. In addition, when the same specific voltage difference $V_{DS}$ is provided between the second drain electrode 26 and the second source electrode 24 of the second transistor 36, the second transistor 36 has a second SS. In this preferred embodiment, the first SS is substantially 0.19 volts/decade amperes (V/decade), and the second SS is substantially 0.53 V/decade. Thus, the first transistor 34 further has the first oxide layer 30 disposed on the first channel layer 28 thereof as compared with the second transistor 36, so that the second SS of the second transistor 36 is larger than the first SS of the first transistor 34. The first transistor 34 can have a faster switching rate so as to rapidly switch the pixel structure 10, and the second transistor 36 can have a lightly curve illustrating the relationship between the second drain current $I_{D2}$ and the voltage difference $V_{GS2}$ between the second gate electrode 16 and the second source electrode 24. For this reason, in the condition of providing different the voltage differences $V_{GS2}$ between the second gate electrode 16 and the second source electrode 24, the second transistor 36 can have different second drain currents $I_{D2}$ so as to provide various kinds of the second drain currents $I_{D2}$ to the OLED 48, and the OLED display can display various brightness in relation to different gray levels.

Figure 11:
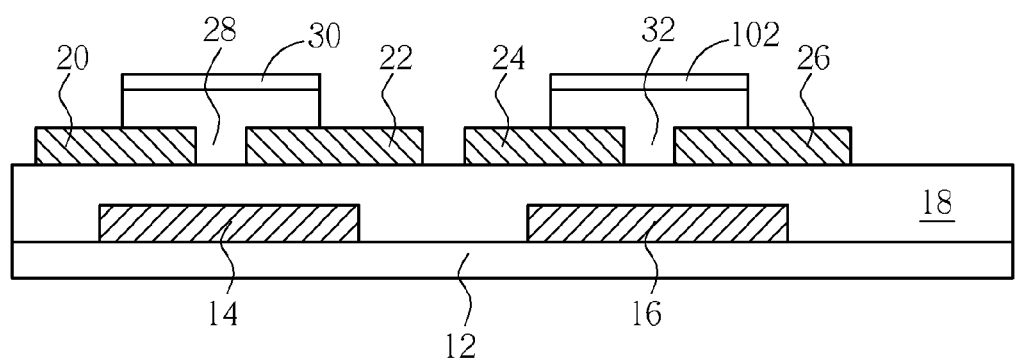
FIG. 11 and FIG. 12 are schematic diagrams illustrating a manufacturing method of the pixel structure of the OLED display according to a second preferred embodiment of the present invention.
Figure 12:
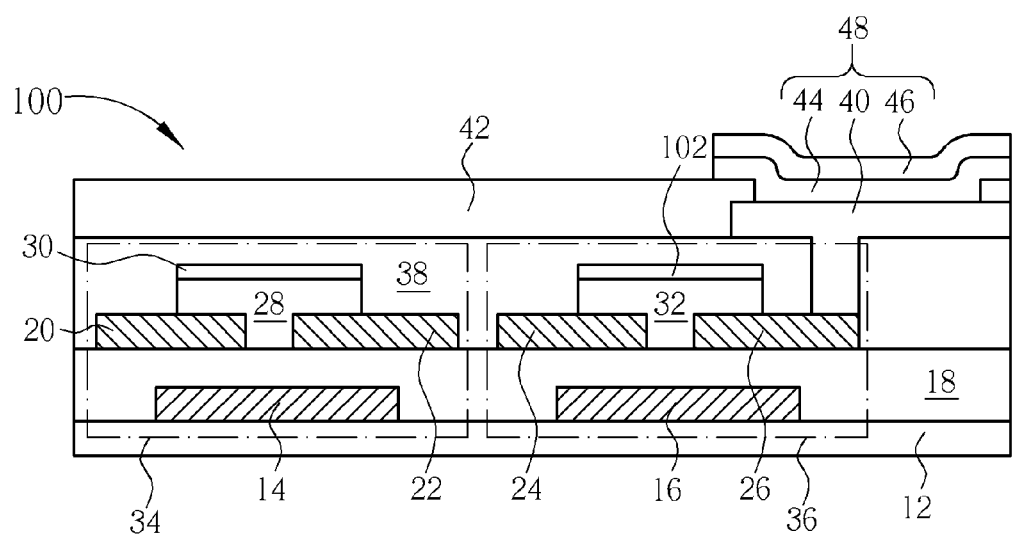
Figure 13:
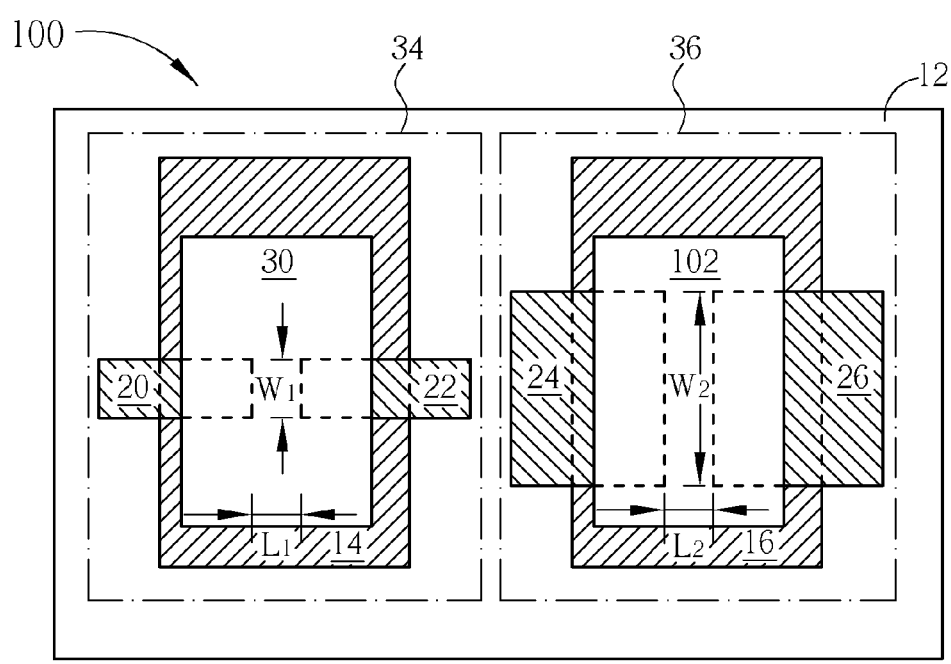
FIG. 13 is a schematic diagram illustrating a top view of the pixel structure of the OLED display according to the second preferred embodiment of the present invention.

Refer to FIG. 11 through FIG. 13, and refer to FIG. 1 and FIG. 3 again. FIG. 11 and FIG. 12 are schematic diagrams illustrating a manufacturing method of the pixel structure of the OLED display according to a second preferred embodiment of the present invention, wherein FIG. 12 is a schematic diagram illustrating a cross section of the pixel structure of the OLED display according to the second preferred embodiment of the present invention. FIG. 13 is a schematic diagram illustrating a top view of the pixel structure of the OLED display according to the second preferred embodiment of the present invention. As compared with the first preferred embodiment, the second oxide layer and the second channel layer in the second preferred embodiment are formed simultaneously. As shown in FIG. 11, this preferred embodiment also utilizes the steps shown in FIG. 1 and FIG. 2 to manufacture the substrate 12, the first gate electrode 14, the second gate electrode 16, the insulating layer 18, the first drain electrode 22, the first source electrode 20, the second drain electrode 26 and the second source electrode 24, and then, the substrate 12 is covered with a channel material layer and an oxide layer in sequence. Next, a photolithographic and etching process is performed to pattern the channel material layer and the oxide layer so as to form the first channel layer 28 and the first oxide layer 30 on the first drain electrode 22, the first source electrode 20 and the insulating layer 18 and form the second channel layer 32 and the second oxide layer 102 on the second drain electrode 26, the second source electrode 24 and the insulating layer 18 simultaneously. The present invention is not limited to this, and the present invention also can perform two photolithographic and etching processes to form the first channel layer 28 and the first oxide layer 30 before forming the second channel layer 32 and the second oxide layer 102; or to form the second channel layer 32 and the second oxide layer 102 before forming the first channel layer 28 and the first oxide layer 30. Subsequently, as shown in FIG. 12, the first patterned passivation layer 38, the transparent electrode 40, the second patterned passivation layer 42, the organic light emitting layer 44 and the metal electrode 46 are sequentially formed on the substrate 12, and the pixel structure 100 of the OLED display of the second preferred embodiment is completed. The present invention is not limited to the above-mentioned steps, and the steps of forming the second channel layer and the second oxide layer of the present invention also can be performed before forming the first channel layer and the first oxide layer. Or, the step of forming the second oxide layer can be performed after forming the second channel layer. As shown in FIG. 13, it is worthy to note that as compared with the first preferred embodiment, besides the first transistor 34 of the second preferred embodiment includes the first oxide layer 30 disposed between the first channel layer 28 and the first patterned passivation layer 38, the second transistor 36 of the second preferred embodiment also includes a second oxide layer 102 disposed between the second channel layer 32 and the first patterned passivation layer 38. In addition, the first transistor 34 of the preferred embodiment has a first channel width W1 and a first channel length L1, and the second transistor 36 has a second channel width W2 and a second channel length L2. Furthermore, the first channel length L1 is substantially the same as the second channel length L2, and the first channel width W1 is smaller than the second channel width W2.

Refer to FIG. 14, and refer to FIG. 13 again. FIG. 14 is a schematic diagram illustrating a relationship between the channel width and the SS of the transistor of the second preferred embodiment in the condition of the channel length being substantially 4 micrometers (μm). As shown in FIG. 14, when the channel lengths are the same, and the first channel layer 28 and the second channel layer 32 respectively have the first oxide layer 30 and the second oxide layer 102 disposed thereon, the larger the channel widths are, the larger the SS is. For this reason, when the first channel length L1 is the same as the second channel length L2 in this preferred embodiment, the first channel width W1 is smaller than the second channel width W2, so that the first SS of the first transistor 34 is smaller than the second SS of the second transistor 36. Thus, the first transistor 34 can have a faster switching rate, and the second transistor 36 can provide various values of the second drain current to the OLED. The present invention is not limited that the first channel layer and the second channel layer respectively have the first oxide layer and the second oxide layer disposed thereon, and the first channel layer and the second channel layer also can have no the first oxide layer and the second oxide layer disposed thereon. The first channel width of the first transistor and the second channel width of the second transistor can be adjusted to be different, and the first channel width is smaller than the second channel width, so that the first SS of the first transistor is smaller than the second SS of the second transistor. Thus, the requirements of the first transistor regarded as the switching transistor and the second transistor regarded as the driving transistor can be satisfied.

In summary, the present invention disposes the first oxide layer only on the first channel layer of the first transistor or manufactures the first transistor and the second transistor having different channel widths, so that the first SS of the first transistor is smaller than the second SS of the second transistor. The current-voltage characteristics of the first transistor regarded as the switching transistor and the second transistor regarded as the driving transistor can be differentiated. The first transistor can have a faster switching rate so as to conform to the use of the switching transistor, and the second transistor can provide various values of the second drain current to conform to the use of the driving transistor.

Those skilled in the art will readily observe that numerous modifications and alterations of the device and method may be made while retaining the teachings of the invention.

What is claimed is:
1. A pixel structure of an organic light emitting diode (OLED) display, comprising:
   a substrate;
   a first transistor, disposed on the substrate, the first transistor being a switching transistor, and the first transistor comprising:
      a first gate electrode;
      an insulating layer, covering the first gate electrode and the substrate;
      a first drain electrode, disposed on the insulating layer;
      a first source electrode, disposed on the insulating layer;
      a first channel layer, disposed on the insulating layer between the first drain electrode and the first source electrode, wherein when a voltage difference is provided between the first drain electrode and the first source electrode of the first transistor, the first transistor has a first subthreshold slope (SS); and
      a first oxide layer, disposed on the first channel layer, and the first oxide layer being directly in contact with the first channel layer;
   a second transistor, disposed on the substrate, the second transistor being a driving transistor, and the second transistor comprising:
      a second gate electrode, disposed between the insulating layer and the substrate, the second gate electrode being electrically connected to the first drain electrode;
      a second drain electrode, disposed on the insulating layer;

a second source electrode, disposed on the insulating layer; and a second channel layer, disposed on the insulating layer between the second drain electrode and the second source electrode, wherein when the voltage difference is provided between the second drain electrode and the second source electrode of the second transistor, the second transistor has a second SS, and the second SS is larger than the first SS;

a first patterned passivation layer, covering a part of the first transistor and the second transistor, wherein the first oxide layer is disposed between the first channel layer and the first patterned passivation layer, the first patterned passivation layer is directly in contact with and covers the second channel layer, and the second channel layer and the first patterned passivation layer have no oxide layer disposed therebetween; and an OLED, disposed on the second drain electrode and the first patterned passivation layer, wherein the second drain electrode is electrically connected to the OLED.

2. The pixel structure of claim 1, wherein a width of the first oxide layer is the same as a width of the first channel layer, and two sides of the first oxide layer are respectively aligned to two sides of the first channel layer.

3. The pixel structure of claim 1, wherein the first oxide layer is silicon oxide.

4. The pixel structure of claim 1, wherein the first channel layer and the second channel layer respectively comprise a metal oxide, polysilicon or amorphous silicon.

5. The pixel structure of claim 4, wherein the metal oxide is indium gallium zinc oxide (IGZO), indium oxide, zinc oxide or gallium oxide.

6. The pixel structure of claim 1, wherein the first channel layer is extended to be disposed between the first drain electrode and the first patterned passivation layer and between the first source electrode and the first patterned passivation layer, the first drain electrode and the first source electrode are disposed between a part of the first channel layer and the insulating layer, the second channel layer is extended to be disposed between the second drain electrode and the first patterned passivation layer and between the second source electrode and the first patterned passivation layer, and the second drain electrode and the second source electrode are disposed between a part of the second channel layer and the insulating layer.

7. The pixel structure of claim 1, wherein the first patterned passivation layer exposes a part of the second drain electrode, and the OLED comprises a transparent electrode, disposed on the second drain electrode and the first patterned passivation layer.

8. The pixel structure of claim 7, further comprising a second patterned passivation layer, and the OLED further comprising an organic light emitting layer and an electrode, wherein the second patterned passivation layer, the organic light emitting layer and the electrode are respectively disposed on the transparent electrode and the first patterned passivation layer in sequence.

* * * * *

UNITED STATES PATENT AND TRADEMARK OFFICE
CERTIFICATE OF CORRECTION

Page 1 of 1

PATENT NO. : 8,981,350 B2
APPLICATION NO. : 13/009835
DATED : March 17, 2015
INVENTOR(S) : Hsing-Hung Hsieh It is certified that error appears in the above-identified patent and that said Letters Patent is hereby corrected as shown below:

On the title page, under item (65), insert item (30)

--(30) Foreign Application Priority Data
Apr. 07, 2010 (TW)......................099110738--.

Signed and Sealed this
Twenty-first Day of July, 2015

Michelle K. Lee
*Director of the United States Patent and Trademark Office*